United States Patent [19]
Nedved

[11] Patent Number: 5,923,532
[45] Date of Patent: Jul. 13, 1999

[54] LANCED CARD GUIDE

[75] Inventor: Gene Nedved, Hiawatha, Iowa

[73] Assignee: Rockwell Science Center, Inc., Costa Mesa, Calif.

[21] Appl. No.: 09/063,841

[22] Filed: Apr. 21, 1998

[51] Int. Cl.[6] .................................................. H05K 7/20
[52] U.S. Cl. .......................... 361/690; 361/752; 361/756; 312/223.1; 312/223.2; 211/41.17
[58] Field of Search ..................................... 361/690, 683, 361/686, 752, 756, 802, 796, 797; 439/61, 64, 377; 312/223.1, 223.2; 211/41.1, 41.17

[56] References Cited

U.S. PATENT DOCUMENTS

| | | |
|---|---|---|
| 3,696,936 | 10/1972 | Straccia et al. ......................... 361/802 |
| 4,327,835 | 5/1982 | Leger ..................................... 211/41.17 |
| 4,519,016 | 5/1985 | Bradley et al. .......................... 361/802 |
| 4,739,444 | 4/1988 | Zushi et al. .............................. 361/691 |
| 4,742,477 | 5/1988 | Phillips et al. .......................... 361/686 |
| 5,172,306 | 12/1992 | Cantrell .................................. 361/802 |
| 5,210,680 | 5/1993 | Scheibler ................................ 361/695 |
| 5,696,668 | 12/1997 | Zenitani et al. ........................ 361/802 |

*Primary Examiner*—Leo P. Picard
*Assistant Examiner*—Boris L. Chervinsky
*Attorney, Agent, or Firm*—Kyle Eppele; James P. O'Shaughnessy

[57] ABSTRACT

A card guide for receiving one or more circuit cards in an electronic device is disclosed. The card guide comprises a generally rectangular plate having a plurality of guides formed thereon for receiving and holding the circuit cards. A plurality of perforations arrayed in the plate regulate the flow of a coolant, such as air, across the circuit cards.

16 Claims, 3 Drawing Sheets

LANCED CARD GUIDE

BACKGROUND OF THE INVENTION

The present invention generally relates to electronic equipment, and more specifically to a card guide for receiving one or more circuit cards within an electronic device.

The reliability and performance of an electronic device such as a piece of avionic equipment or the like are closely related to the temperature at which the device's internal electrical and electronic components must operate. For example, electronic devices may include a number of integrated circuit components mounted on one or more circuit cards supported within the device's chassis or housing. During use, these components may generate excess heat which must be dissipated to prevent damage to the components or degradation of their performance.

Typically, heat generated within an electronic device is dissipated via convection by passing a coolant, usually air, across the faces of the circuit cards contained therein. A card guide receives the circuit cards and holds them parallel to the flow of the coolant. Preferably, the card guide allows the circuit cards to be easily inserted in and removed from the electronic device during maintenance.

It is often desirable to regulate the amount of coolant provided to the electrical and electronic components within the electronic device. This has traditionally been accomplished by placing a flow metering plate within the chassis of the electronic device to restrict the flow of coolant over the circuit cards. However, the flow metering plate increases the weight of the electronic device and occupies valuable space inside its chassis. This is particularly undesirable for avionic equipment wherein the size and weight of the equipment may adversely affect the performance of the aircraft.

Consequently, it would be advantageous to provide a card guide having a means for regulating the flow of a coolant, such as air, across the circuit cards of an electronic device thereby eliminating the need for a flow metering plate while retaining its function.

SUMMARY OF THE INVENTION

Accordingly, the present invention provides a novel card guide for receiving one or more circuit cards in an electronic device. The card guide comprises a plate having a plurality of guides formed thereon. The guides slidably engage edges of the circuit cards so that the card guide may hold the circuit cards substantially parallel to the flow of coolant through the electronic device. A plurality of holes or perforations arrayed in the plate regulate the flow of a coolant across the circuit cards. The card guide therefore eliminates the need for a flow metering plate while retaining its function.

It is to be understood that both the foregoing general description and the following detailed description are exemplary and explanatory only and are not restrictive of the invention claimed.

The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which.

DESCRIPTION OF THE PREFERRED EMBODIMENT

Reference will now be made in detail to the presently preferred embodiment of the invention, an example of which is illustrated in the accompanying drawings.

Figure 1:
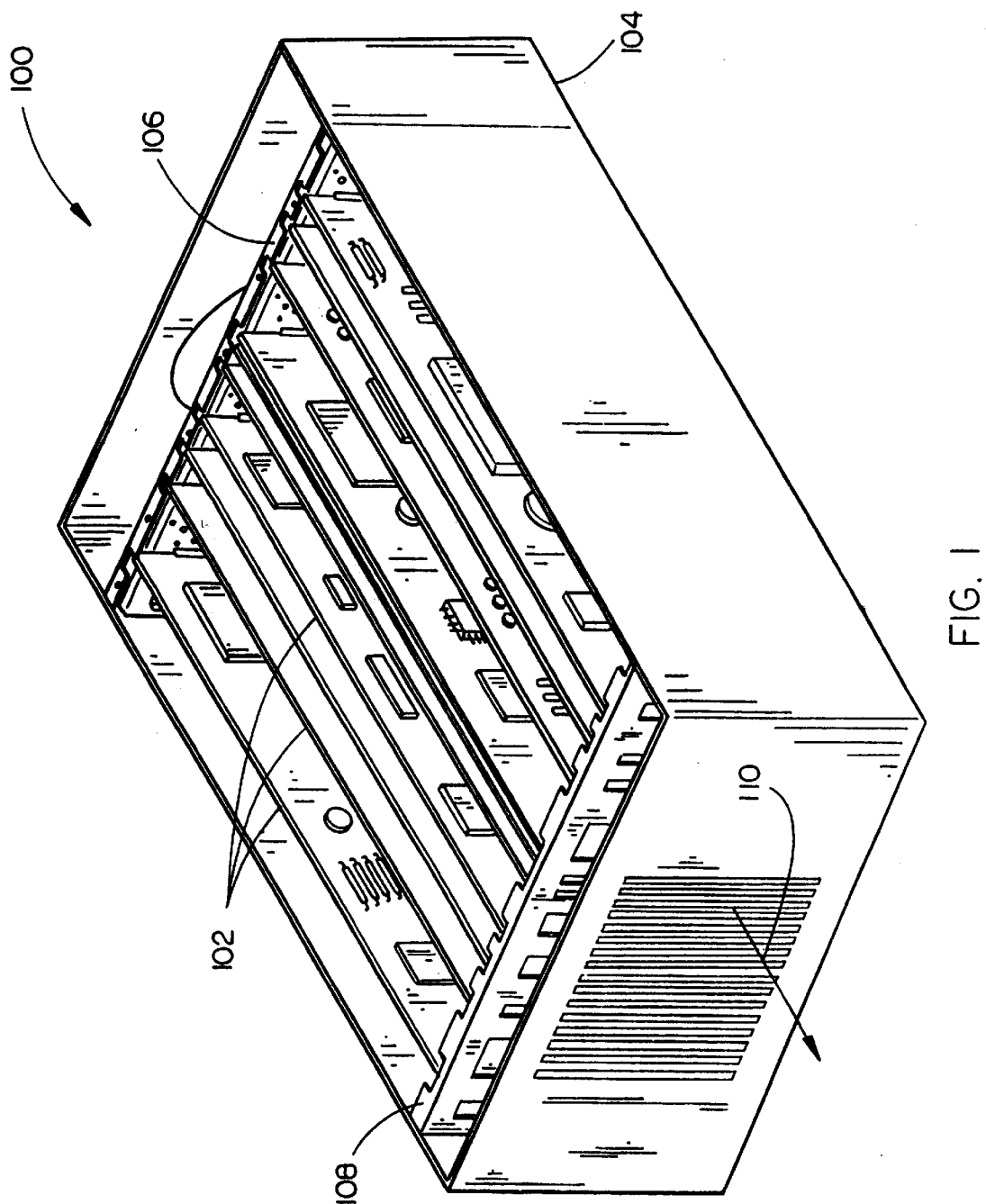
FIG. 1 is an isometric view depicting an electronic device utilizing the card guide of the present invention.

Referring now to FIG. 1, an electronic device utilizing the card guide of the present invention is shown. The electronic device 100 may include one or more circuit cards 102 housed within a chassis or housing 104. The chassis 104 of the electronic device 100 may include a lid or top which may be removed so that the circuit cards 102 contained therein may be more easily accessed during maintenance of the electronic device 100 (To facilitate illustration of the interior of electronic device 100, the lid or top of the chassis 104 is removed and is not shown in FIG. 1). Electrical and electronic components such as, for example, integrated circuit devices including processors, memory devices, or the like, may be mounted on each of the circuit cards 102 for performing the functions of the electronic device 100. During operation, these components may generate excess heat which must be dissipated to prevent degradation of the performance of the electronic device 100 or damage to the components themselves.

Card guides 106 & 108 receive and hold the circuit cards 102 within the chassis or housing 104 of the electronic device 100. During operation of the electronic device 100, a coolant may flow through the card guides 106 & 108 and over the circuit cards 102 in the direction shown by the arrow 110 to dissipate heat from the electronic components mounted thereon via convention. Preferably, the circuit cards 102 are held substantially perpendicular to the card guides 106 & 108 so that they are parallel to each other and the general direction of flow of the coolant 110. In most applications, the coolant utilized with the present invention will be air supplied by a cooling fan or air conditioning system (not shown). This air may be conditioned to remove moisture which may collect on and cause damage to the electronic devices mounted on the circuit cards 102. However, other coolants or refrigerants may be utilized with the present invention as necessary to provide a sufficient amount of cooling to the electronic device 100.

Turning now to FIGS. 2 through 5, the card guide 106 of the present invention is shown. The card guide 106 provides a means for receiving and holding one or more circuit cards 102 within the electronic device 100 and regulating the flow of coolant across the cards 102. The card guide 106 thus eliminates the need for a separate flow metering plate while retaining its function, thereby reducing the size, weight, and complexity of the electronic device 100 accordingly.

The card guide 106 comprises a rectangular plate 112 having a plurality holes or perforations 114, 116 & 118 arrayed therein to allow coolant to flow through the plate 112. A plurality of guides 120 may be formed on the inner face of the rectangular plate 112. Preferably, the guides 120 are aligned in a plurality of parallel, generally vertical rows spaced along the inner surface of the rectangular plate 112 corresponding to the number of circuit cards contained in the electronic device 100. For example, the electronic device 100 shown in FIG. 1, contains ten circuit cards 102. Thus, as shown in FIGS. 2 and 3, the card guide 106 utilized in the device 100 may have ten rows of guides 120, wherein each row may include three vertically aligned guides 120 for slidably receiving a circuit card 102.

The card guide 106 may be fabricated from a single sheet of metal such as aluminum, steel, titanium, or the like. Mounting members 132, 136 & 140 may be formed along the side, top and bottom edges of the plate 112, respectively, to mount the card guide 106 within the chassis 104 of the electronic device 100 (see FIG. 1). Fasteners such as screws, rivets, or the like (not shown) may engage holes 134 formed in the mounting members 132, 136 & 140 to secure the card guide 106 within the chassis 104 of the electronic device 100 (see FIG. 1). Preferably, the upper mounting member 136 includes a plurality of rectangular notches 138 spaced along its length. These notches 138 allow each of the circuit cards 102 to pass through the upper mounting member 136 so that they may slidably engage a row of guides 120. Similarly, the lower mounting member 140 may include a plurality of indentations 142. Each of these indentations 142 may receive a lower corner of a circuit card 102 when the circuit card 102 is properly seated within the card guide 106.

Figure 2:
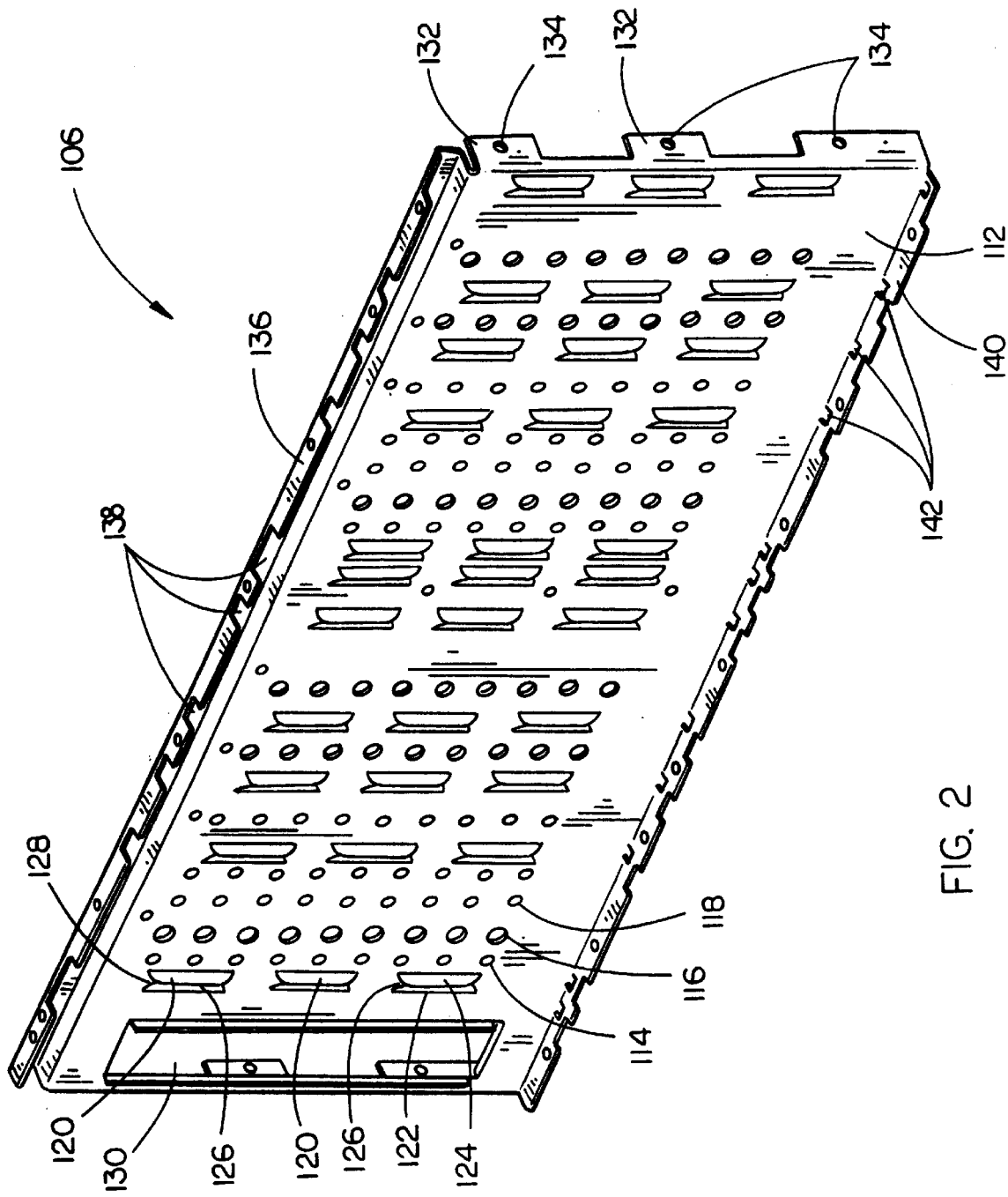
FIG. 2 is an isometric view depicting the card guide of the present invention.
Figure 3:
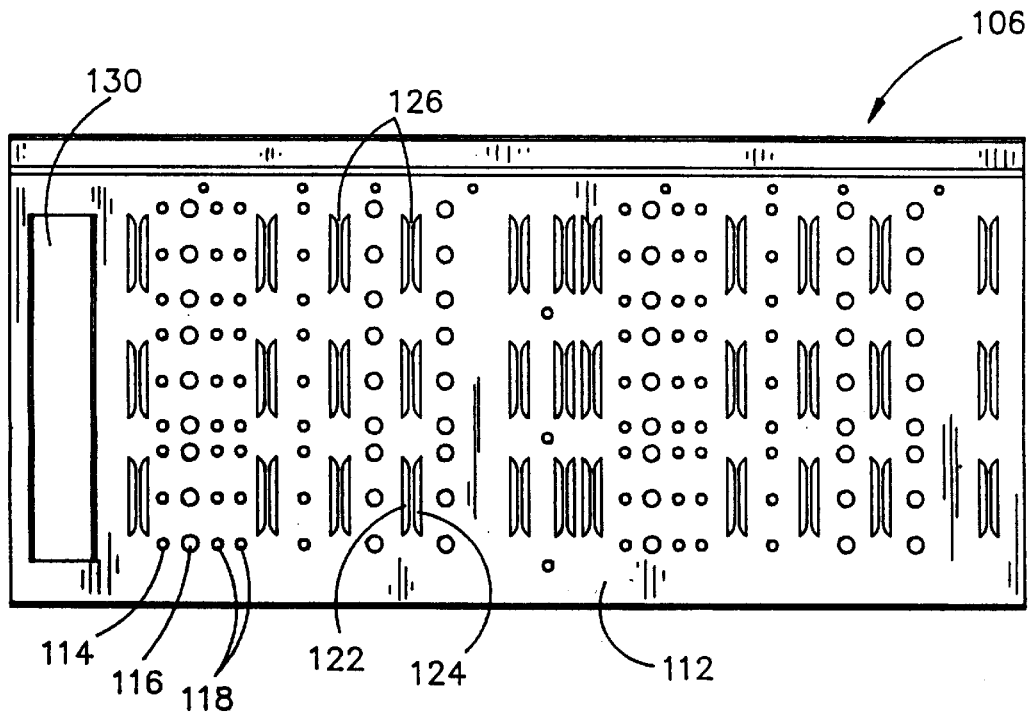
FIG. 3 is a side elevational view of the card guide shown in FIG. 2.
Figure 4:
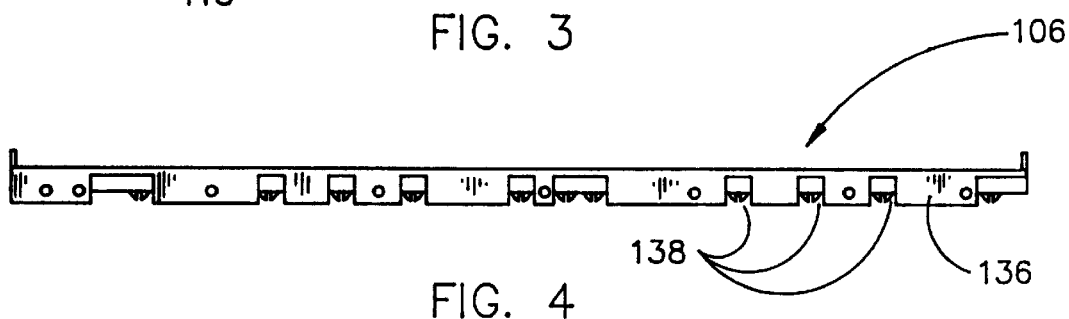
FIG. 4 is a top plan view of the card guide shown in FIG. 2.
Figure 5:
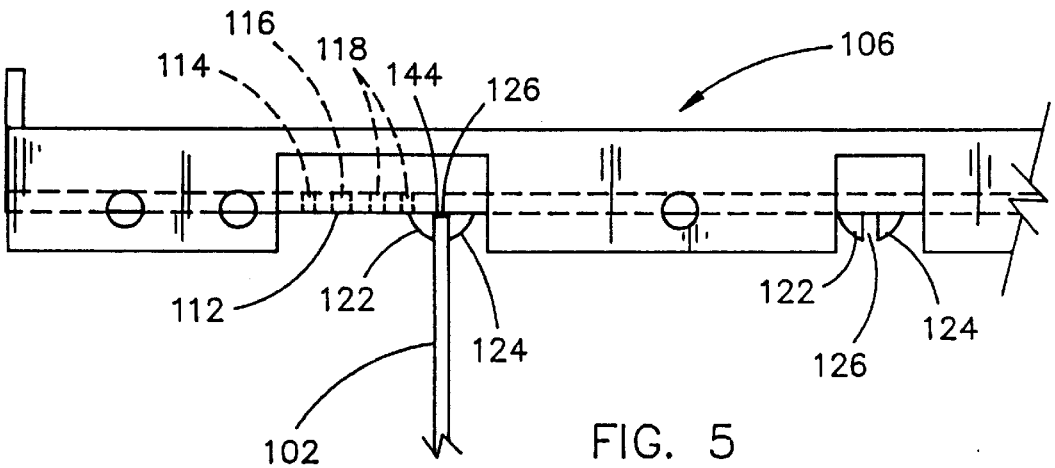
FIG. 5 is a partial top plan view of the card guide shown in FIG. 2 having a circuit card engaged therein.

As shown in FIGS. 2, 3, and 5, each of the guides 120 may include a left guide member 122 and a right guide member 124 which protrude from the inner face of the plate 112. The left and right guide members 122 & 124 are spaced apart from each other to form a channel or groove 126 sized to slidably receive an edge of a circuit card 102. Preferably, the inner faces of the upper and lower ends of the guide members 122 & 124 may be curved outwardly. In this manner, the width of the upper and lower ends 128 of the groove 126 is increased to more easily engage the edge 144 of a circuit card 102 as it is inserted in or removed from the card guide 106.

As shown in FIGS. 2, 3 and 5, the rectangular plate 112 may include a plurality holes or perforations 114, 116 & 118 arrayed therein. These perforations 114, 116 & 118 allow coolant to flow through the plate 112 and over the circuit cards 102. Preferably, the number and size of perforations 114, 116 & 118 may be adjusted for the particular electronic device 100 in which the card guide 106 is installed to properly regulate the flow of coolant through the plate 112 and over the circuit cards 102 of that device 100. Further, the distribution of coolant throughout the electronic device 100 may be controlled by adjusting the size and position of the perforations 114, 116 & 118 in the plate 112. In this manner, the flow of coolant across the face of a particular circuit card 102 may restricted to the amount necessary to properly dissipate heat from the electronic components mounted thereon. This allows coolant to be conserved for other uses and helps to prevent moisture in the coolant (i.e., unconditioned air) from condensing on the circuit cards 102. Further, the distribution of coolant flow may be optimized to increase the efficiency at which heat is dissipated from each circuit card 102.

The card guide 106 may include a rectangular aperture 130 through which communication and coupling apparatus such as cables, wires, or the like may pass (not shown). The communication and coupling apparatus may, for example, be used to couple the circuit cards 102 with a connector mounted on the front of the chassis 104 of the electronic device 100.

It is believed that the card guide of the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A card guide for holding a circuit card in an electronic device, comprising:

a plate having a guide formed thereon for removably receiving said circuit card so that said circuit card is held substantially parallel to the flow of a coolant through said electronic device;

said plate including at least two holes, the first hole having a first area and a first position relative to said circuit card, the second hole having a second area larger than the first area and a second position relative to said circuit card such that the size and position of each of the holes are selected to regulate the flow of the coolant over said circuit card to optimize heat dissipation by the coolant.

2. The card guide according to claim 1, wherein said guide includes a channel having a width for slidably receiving an edge of said circuit card.

3. The card guide according to claim 2, wherein the width of an end of said channel is increased for guiding an edge of said circuit card into said channel.

4. The card guide according to claim 1, wherein said coolant is air.

5. The card guide according to claim 1, wherein said plate further includes an aperture through which a communication and coupling apparatus may pass.

6. The card guide according to claim 1, further comprising a mounting member formed thereon for mounting the plate within said electronic device.

7. A card guide for holding a plurality of circuit cards in an electronic device, comprising:

a plate having a plurality of holes arrayed therein for regulating the flow of a coolant, said plurality of holes including a first hole having a first area and a first position relative to a first one of said circuit cards, and the second hole having a second area larger than the first area and a second position relative to said first one of said circuit cards such that the size and position of each of the holes are selected to regulate the flow of the coolant over said first one of said circuit cards to optimize heat dissipation by the coolant; and a plurality of guides formed on said plate for removably receiving said plurality of circuit cards so that said circuit cards are held substantially perpendicular to said plate and parallel to each other wherein the regulated coolant may flow across the faces of said circuit cards.

8. The card guide according to claim 7, wherein each of said plurality of guides includes a channel having a width for slidably receiving an edge of one of said plurality of circuit cards.

9. The card guide according to claim 8, wherein the width of an end of said channel is increased for guiding an edge of said circuit card into said channel.

10. The card guide according to claim 7, wherein said coolant is air.

11. The card guide according to claim 7, wherein said plate further includes an aperture through which a communication and coupling apparatus may pass.

12. The card guide according to claim 7, wherein said plate further includes a mounting member formed thereon for mounting said plate within said electronic device.

13. The card guide according to claim 7, wherein said plate includes a third hole having a third area larger than the first area and a third position relative to a second one of said circuit cards such that the size and position of the third hole is selected to regulate the flow of the coolant over said second one of said circuit cards to optimize heat dissipation by the coolant.

14. A card guide for holding a circuit card in an electronic device, comprising:

means for removably receiving said circuit card so that said circuit card is held substantially parallel to the flow of a coolant through said electronic device; and means for regulating the flow of a coolant over said circuit card, said flow regulation means including a first hole having a first area and a first position relative to said circuit card, and the second hole having a second area larger than the first area and a second position relative to said circuit card such that the size and position of each of the holes are selected to regulate the flow of the coolant over said circuit card to optimize heat dissipation by the coolant.

15. The card guide according to claim 14, wherein said coolant is air.

16. The card guide according to claim 14, further comprising means for mounting the card guide within said electronic device.

* * * * *